(12) United States Patent
Lee et al.

(10) Patent No.: US 12,731,822 B2
(45) Date of Patent: Sep. 8, 2026

(54) LITHIUM SECONDARY BATTERY WITH INTEGRATED DISPLAY PANEL

(71) Applicant: SK ON CO., LTD., Seoul (KR)

(72) Inventors: Sang Bin Lee, Daejeon (KR); Young Ha Kim, Daejeon (KR); Ji Hyung Kim, Daejeon (KR); Ho Jin Hwang, Daejeon (KR)

(73) Assignee: SK On Co., Ltd., Seoul (KR)

( * ) Notice: Subject to any disclaimer, the term of this patent is extended or adjusted under 35 U.S.C. 154(b) by 534 days.

(21) Appl. No.: 18/355,412

(22) Filed: Jul. 20, 2023

(65) Prior Publication Data

US 2024/0063450 A1 Feb. 22, 2024

(30) Foreign Application Priority Data

Aug. 17, 2022 (KR) ........................ 10-2022-0102820

(51) Int. Cl.

| | |
|---|---|
| ***H01M 10/48*** | (2006.01) |
| ***H01M 10/42*** | (2006.01) |
| ***H01M 50/105*** | (2021.01) |
| ***H01M 50/531*** | (2021.01) |
| ***H05K 5/00*** | (2025.01) |

(52) U.S. Cl.

CPC ....... *H01M 10/488* (2013.01); *H01M 10/425* (2013.01); *H01M 50/531* (2021.01); *H05K 5/0086* (2013.01); *H01M 50/105* (2021.01); *H01M 2220/30* (2013.01)

(58) Field of Classification Search

CPC ............. H01M 10/488; H01M 10/425; H01M 10/052; H01M 10/0585; H01M 10/0525; H01M 10/058; H01M 10/4251; H01M 10/482; H01M 10/484; H01M 10/486; H01M 50/531; H01M 50/55; H01M 50/105; H01M 50/103; H01M 50/107; H01M 2220/30

See application file for complete search history.

(56) References Cited

U.S. PATENT DOCUMENTS

| | | | | |
|---|---|---|---|---|
| 2016/0097501 A1* | 4/2016 | Yoshitani | ................ | H02J 50/20 362/183 |
| 2016/0157372 A1* | 6/2016 | Hiroki | .................. | G06F 1/1652 361/679.01 |
| 2016/0313769 A1* | 10/2016 | Yoshitani | ............. | G06F 1/1694 |

FOREIGN PATENT DOCUMENTS

| | | |
|---|---|---|
| JP | 2016-085457 A | 5/2016 |
| KR | 10-2015-0056485 A | 5/2015 |
| KR | 10-2015-0096650 A | 8/2015 |
| KR | 10-2016-0064979 A | 6/2016 |

(Continued)

OTHER PUBLICATIONS

Office Action for Korean Patent Application No. 10-2022-0102820 issued by the Korean Patent Office on Jun. 11, 2026.

*Primary Examiner* — Matthew W Van Oudenaren
(74) *Attorney, Agent, or Firm* — IP & T GROUP LLP

(57) ABSTRACT

A lithium secondary battery with an integrated display panel may include an electrode assembly including a cathode and an anode disposed to face the cathode, and an outer case which accommodates the electrode assembly and has at least one surface provided as a display panel. By providing at least one surface of the outer case as the display panel, a secondary battery having the reduced volume may be provided when designing the secondary battery with the same capacity.

7 Claims, 5 Drawing Sheets

(56) References Cited

FOREIGN PATENT DOCUMENTS

| | | | |
|---|---|---|---|
| KR | 10-2017-0006770 | A | 1/2017 |
| KR | 10-2022-0098527 | A | 7/2022 |

* cited by examiner

LITHIUM SECONDARY BATTERY WITH INTEGRATED DISPLAY PANEL

CROSS-REFERENCE TO RELATED APPLICATION AND CLAIM OF PRIORITY

This application claims priority to Korean Patent Application No. 10-2022-0102820 filed on Aug. 17, 2022 in the Korean Intellectual Property Office (KIPO), the entire disclosure of which is incorporated by reference herein.

BACKGROUND

1. Field

The present disclosure relates to a lithium secondary battery with an integrated display panel.

2. Description of the Related Art

A secondary battery is a battery which may be repeatedly charged and discharged. With rapid progress of information and communication, and display industries, the secondary battery has been widely applied to various portable telecommunication electronic devices such as a camcorder, a mobile phone, a laptop computer as a power source thereof. Recently, a battery pack including the secondary battery has also been developed and applied to an eco-friendly automobile such as a hybrid vehicle as a power source thereof.

Examples of the secondary battery may include a lithium secondary battery, a nickel-cadmium battery, a nickel-hydrogen battery and the like. Among them, the lithium secondary battery has a high operating voltage and a high energy density per unit weight, and is advantageous in terms of a charging speed and light weight. In this regard, the lithium secondary battery has been actively developed and applied as a power source.

For example, the lithium secondary battery may include: an electrode assembly including a cathode, an anode, and a separation membrane (separator); and an electrolyte in which the electrode assembly is impregnated. In addition, the lithium secondary battery may further include, for example, a pouch-shaped outer case which accommodates the electrode assembly and the electrolyte.

However, when producing a portable electronic communication device, etc. by attaching a display panel, etc. to the lithium secondary battery, due to a volume of the outer case itself, the volume of the portable electronic communication device, etc. may be increased.

Therefore, it is necessary to design an outer case capable of suppressing an increase in the volume even when the display panel and the lithium secondary battery are included together in the portable electronic communication device.

SUMMARY

An object of the present disclosure is to provide a lithium secondary battery with a reduced volume by including an integrated display panel provided on least one surface thereof.

To achieve the above objects, according to an aspect of the present disclosure, there is provided a lithium secondary battery with an integrated display panel including: an electrode assembly which includes a cathode and an anode disposed to face the cathode; and an outer case which accommodates the electrode assembly and has at least one surface provided as a display panel.

In some embodiments, the cathode may include a cathode current collector, a cathode active material layer formed on at least one surface of the cathode current collector, and a cathode tab protruding from the cathode current collector, and the anode may include an anode current collector, an anode active material layer formed on at least one surface of the anode current collector, and an anode tab protruding from the anode current collector.

In some embodiments, the cathode tab and the anode tab may be disposed only inside the outer case.

In some embodiments, the lithium secondary battery with an integrated display panel may further include a circuit structure disposed between the electrode assembly and the display panel, and electrically connected with the display panel.

In some embodiments, the lithium secondary battery with an integrated display panel may further include a sealing case which surrounds the circuit structure.

In some embodiments, at least one surface of the sealing case may include a connection part which electrically connects the circuit structure with the electrode assembly.

In some embodiments, the connection part may include a cathode connection part electrically connected to the cathode tab, and an anode connection part electrically connected to the anode tab.

In some embodiments, the circuit structure may further include a cathode connection line which extends toward the cathode connection part to be electrically connected to the cathode tab, and an anode connection line which extends toward the anode connection part to be electrically connected to the anode tab.

In some embodiments, the circuit structure may include a display panel driving integrated circuit chip, and a connection circuit wiring which electrically connects the display panel driving integrated circuit chip with the display panel.

In some embodiments, two surfaces of the outer case facing each other may be provided as the display panels.

In the lithium secondary battery with an integrated display panel according to example embodiments of the present disclosure, at least one surface of an outer case may be formed as a display panel. Therefore, since there is no need to separately attach the display panel to the battery, the volume thereof may be relatively reduced and space efficiency may be improved.

In some embodiments, since the lithium secondary battery with an integrated display panel may include a circuit structure therein, it is possible to drive the display panel without a separate external circuit structure. Accordingly, space efficiency of the lithium secondary battery with an integrated display panel may be improved and battery capacity for driving the display panel may be increased.

DETAILED DESCRIPTION OF THE INVENTION

Figure 1:
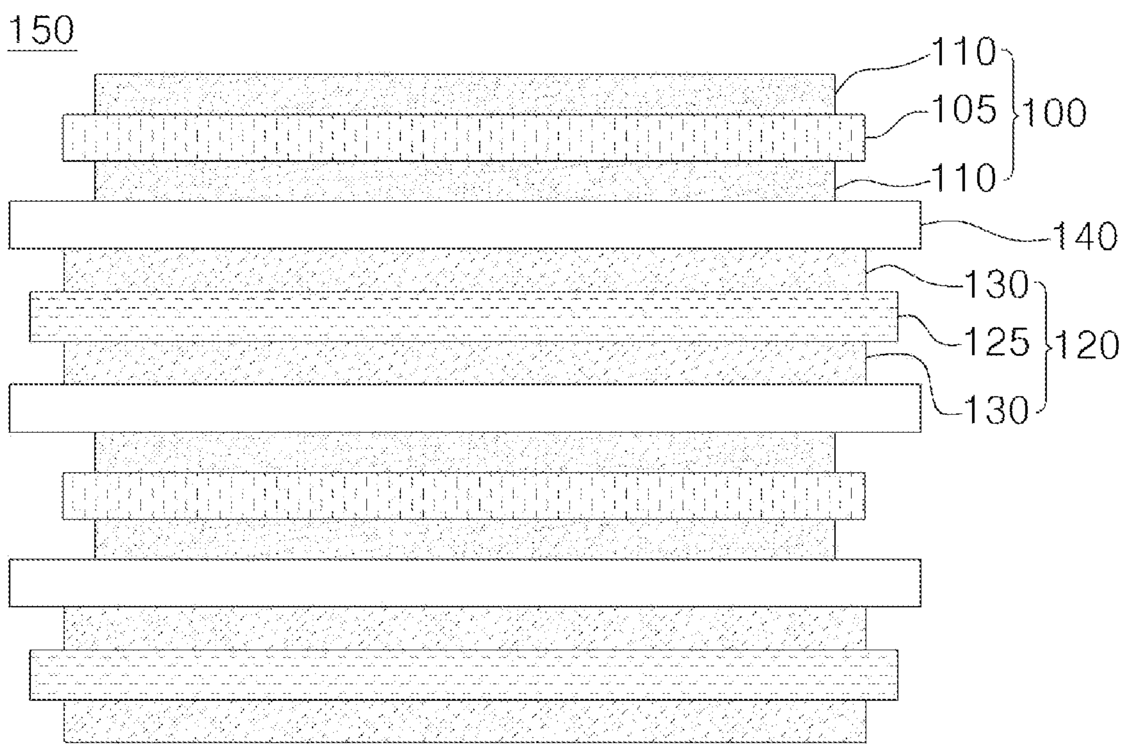
FIG. 1 is a schematic cross-sectional view illustrating an electrode assembly in accordance with example embodiments.

According to embodiments of the present disclosure, a lithium secondary battery with an integrated display panel may be provided.

Hereinafter, embodiments of the present application will be described in detail. In this regard, the present disclosure may be altered in various ways and have various embodiments, such that specific embodiments will be illustrated in the drawings and described in detail in the present disclosure. However, the present disclosure is not limited to the specific embodiments, and it will be understood by those skilled in the art that the present disclosure is to cover all modifications, equivalents, and alternatives falling within the spirit and scope of the present disclosure.

Unless otherwise defined, all terms including technical and scientific terms used herein have the same meaning as commonly understood by one of ordinary skill in the art to which the present disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic cross-sectional view illustrating an electrode assembly according to example embodiments.

Referring to FIG. 1, an electrode assembly 150 may include a cathode 100, an anode 120, and a separation membrane 140 interposed between the cathode 100 and the anode 120.

According to an example embodiment, the cathode 100 may include a cathode current collector 105 and a cathode active material layer 110 disposed on the cathode current collector 105 and including a cathode active material. The cathode active material may include a compound capable of reversibly intercalating and de-intercalating lithium ions.

The cathode 100 may be prepared by coating the cathode current collector 105 with a cathode slurry, followed by compressing and drying the same. The cathode slurry may be prepared by mixing the cathode active material with a binder, a conductive material and/or a dispersant in a solvent, followed by stirring the same.

The cathode current collector 105 may include a metal material which has no reactivity in a charging/discharging voltage range of the secondary battery and facilitates application and adhesion of the electrode active material. For example, the cathode current collector 105 may include stainless steel, nickel, aluminum, titanium, copper, or an alloy thereof. In some embodiments, the cathode current collector 105 may include aluminum or an aluminum alloy.

The cathode active material may include lithium-transition metal composite oxide particles. For example, the lithium-transition metal composite oxide particles include nickel (Ni), and may further include at least one of cobalt (Co) and manganese (Mn).

For example, the lithium-transition metal composite oxide particles may be represented by Formula 1 below.

$$Li_xNi_{1-y}M1_yO_{2+z} \quad \text{[Formula 1]}$$

In Formula 1, x may range of $0.9 \le x \le 1.2$, y may range of $0 \le y \le 0.7$, and z may range of $-0.1 \le z \le 0.1$. M1 may represent at least one element selected from the group consisting of Na, Mg, Ca, Y, Ti, Zr, Hf, V, Nb, Ta, Cr, Mo, W, Mn, Co, Fe, Cu, Ag, Zn, B, Al, Ga, Sn or Zr.

The binder may include, for example, an organic binder such as vinylidene fluoride-hexafluoropropylene copolymer (PVDF-co-HFP), polyvinylidene fluoride (PVDF), polyacrylonitrile, polymethyl methacrylate, etc., or an aqueous binder such as styrene-butadiene rubber (SBR). The binder may be used together with a thickener such as carboxymethyl cellulose (CMC).

For example, a PVDF-based binder may be used as the binder for forming the cathode. In this case, an amount of the binder for forming the cathode active material layer 110 may be reduced and an amount of particles of the cathode active material layer may be relatively increased, and thereby, the output and capacity of the secondary battery may be improved. The conductive material may be included to facilitate electron transfer between the cathode active material particles. For example, the conductive material may include a carbon-based conductive material such as graphite, carbon black, graphene, or carbon nanotubes and/or a metal-based conductive material such as tin, tin oxide, titanium oxide, or a perovskite material such as $LaSrCoO_3$, and $LaSrMnO_3$, etc.

According to example embodiments, the anode 120 may include an anode current collector 125 and an anode active material layer 130 disposed by applying an anode active material to the anode current collector 125.

The anode active material useable in the present disclosure may include any material known in the related art, so long as it can intercalate and deintercalate lithium ions, without particular limitation thereof. For example, carbon-based materials such as crystalline carbon, amorphous carbon, carbon composite, carbon fiber, etc.; a lithium alloy; a silicon (Si)-based active material, or the like may be used. Examples of the amorphous carbon may include hard carbon, cokes, mesocarbon microbead (MCMB) calcined at 1500° C. or lower, mesophase pitch-based carbon fiber (MPCF) or the like.

The crystalline carbon may include, for example, graphite-based carbon such as natural graphite, artificial graphite, graphite cokes, graphite MCMB, graphite MPCF or the like. Other elements included in the lithium alloy may include, for example, aluminum, zinc, bismuth, cadmium, antimony, silicone, lead, tin, gallium, indium or the like.

The silicon-based active material may include $SiO_x$ ($0<x<2$) or $SiO_x$ ($0<x<2$) containing a lithium (Li) compound. The $SiO_x$ containing the Li compound may be $SiO_x$ containing lithium silicate. The lithium silicate may be present in at least a portion of $SiO_x$ ($0<x<2$) particles, for example, may be present inside and/or on surfaces of the $SiO_x$ ($0<x<2$) particles. In one embodiment, the lithium silicate may include $Li_2SiO_3$, $Li_2Si_2O_5$, $Li_4SiO_4$, $Li_4Si_3O_8$ and the like.

The silicon-based active material may include, for example, a silicon-carbon composite compound such as silicon carbide (SiC).

The anode current collector 125 may include stainless steel, copper, nickel, aluminum, titanium, or an alloy thereof. In some embodiments, the anode current collector 125 includes copper or a copper alloy.

For example, the anode active material may be prepared in the form of a slurry by mixing it with the above-described binder, conductive material, and thickener in a solvent, followed by stirring the same. At least one surface of the anode current collector 125 may be coated with the slurry, followed by compressing and drying to prepare the anode 120 including the anode active material layer 130.

As the binder and the conductive material, materials which are substantially the same as or similar to the above-described materials may be used. In some embodiments, a binder for forming the anode may include, for example, an aqueous binder such as styrene-butadiene rubber (SBR) for consistency with the carbon-based active material, and may be used together with a thickener such as carboxymethyl cellulose (CMC).

The separation membrane 140 may be interposed between the cathode 100 and the anode 120. The separation membrane 140 may include a porous polymer film made of a polyolefin polymer such as ethylene homopolymer, propylene homopolymer, ethylene/butene copolymer, ethylene/hexene copolymer, ethylene/methacrylate copolymer. The separation membrane may include a nonwoven fabric made of glass fiber having a high melting point, polyethylene terephthalate fiber or the like.

In some embodiments, the anode 120 may have an area and/or volume (e.g., a contact area with the separation membrane 140) larger than those/that of the cathode 100. Thereby, lithium ions generated from the cathode 100 may be smoothly moved to the anode 120 without being precipitated in the middle.

According to example embodiments, an electrode cell is defined by the cathode 100, the anode 120 and the separation membrane 140, and a plurality of electrode cells may be laminated to form an electrode assembly.

Figure 2:
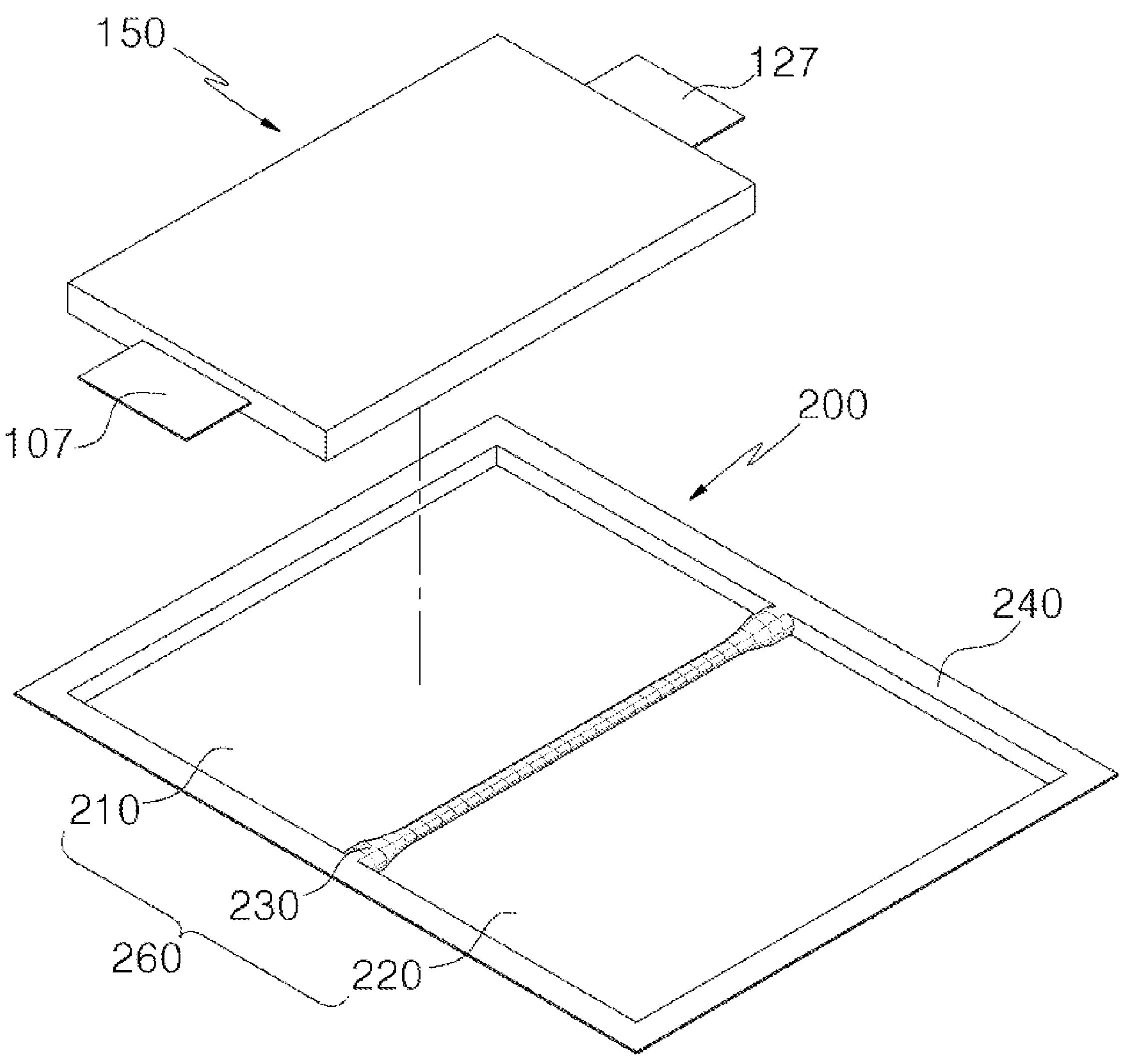
FIG. 2 is a schematic perspective view of a pouch film and the electrode assembly in accordance with example embodiments.

FIG. 2 is a schematic perspective view of a pouch film and the electrode assembly according to example embodiments.

FIG. 2 shows a case where a type of an outer case is a pouch for a secondary battery as an example. However, the type of the outer case is not limited to the pouch for a secondary battery.

For the convenience of description, in FIG. 2, details of a display panel provided on one surface of an outer case 200 and a circuit structure accommodated together with the electrode assembly 150 are not illustrated.

Referring to FIG. 2, the outer case 200 may include a pouch film 260, a sealing part 240 including a circumference of the pouch film 260, and housing parts 210 and 220 formed by recessing the pouch film from the sealing part 240.

In some embodiments, the outer case 200 may further include a division part 230 provided to surround the housing parts 210 and 220 together with the sealing part 240.

For example, the housing parts 210 and 220 may have a recess shape disposed to be recessed in a predetermined depth from the sealing part 240. The electrode assembly 150 may be inserted and accommodated in the housing parts 210 and 220. For example, the housing parts 210 and 220 may have a size and shape enough to accommodate the electrode assembly 150.

In some embodiments, a cathode tab 107 and an anode tab 127 may be formed by protruding from the cathode current collector 105 and the anode current collector 125, respectively, which belong to each electrode cell. The electrode assembly 150 including the cathode tab 107 and the anode tab 127 may be inserted into the housing parts 210 and 220 of the outer case 200.

According to example embodiments, the housing parts 210 and 220 may be divided into a first housing part 210 and a second housing part 220 by the division part 230. The first housing part 210 may cover an upper portion of the electrode assembly 150. In some embodiments, a lower portion of the electrode assembly 150 may be inserted into the second housing part 220, and then the first housing part 210 may cover the upper portion of the electrode assembly 150.

The division part 230 shown in FIG. 2 has a structure protruding at a predetermined height, but the division part 230 is not limited to a specific structure, and the division part 230 may be a virtual line segment or a virtual region.

During manufacturing, the electrode assembly 150 is inserted into the first housing part 210 or the second housing part 220, and then the first housing part 210 or the second housing part 220 may be folded along the division part 230, such that the electrode assembly 150 may be surrounded by the outer case 200. In this case, a portion of the sealing part 240, which is located around the first housing part 210 and a portion of the sealing part 240, which is located around the second housing part 220 may abut each other.

The sealing parts 240 may be compressed or fused, and the electrode assembly 150 may be sealed inside the outer case 200.

A lithium secondary battery may be defined by accommodating the electrode assembly 150 together with an electrolyte in the outer case 200. According to example embodiments, a non-aqueous electrolyte may be used as the electrolyte.

The non-aqueous electrolyte includes a lithium salt of an electrolyte and an organic solvent, and the lithium salt may be represented by, for example, $Li^+X^-$. An anion ($X^-$) of the lithium salt may include, for example, $F^-$, $Cl^-$, $Br^-$, $I^-$, $NO_3^-$, $N(CN)_2^-$, $BF_4^-$, $ClO_4^-$, $PF_6^-$, $(CF_3)_2PF_4^-$, $(CF_3)_3PF_3^-$, $(CF_3)_4PF_2^-$, $(CF_3)_5PF^-$, $(CF_3)_6P^-$, $CF_3SO_3^-$, $CF_3CF_2SO_3^-$, $(CF_3SO_2)_2N^-$, $(FSO_2)_2N^-$, $CF_3CF_2(CF_3)_2CO^-$, $(CF_3SO_2)_2CH^-$, $(SF_5)_3C^-$, $(CF_3SO_2)_3C^-$, $CF_3(CF_2)_7SO_3^-$, $CF_3CO_2^-$, $CH_3CO_2^-$, $SCN^-$, $(CF_3CF_2SO_2)_2N^-$ and the like.

As the organic solvent, for example, propylene carbonate (PC), ethylene carbonate (EC), diethyl carbonate (DEC), dimethyl carbonate (DMC), ethylmethyl carbonate (EMC), methylpropyl carbonate, dipropyl carbonate, dimethyl sulfoxide, acetonitrile, dimethoxyethane, diethoxyethane, vinylene carbonate, sulforane, γ-butyrolactone, propylene sulfite, tetrahydrofuran, and the like may be used. These compounds may be used alone or in combination of two or more thereof.

Figure 3:
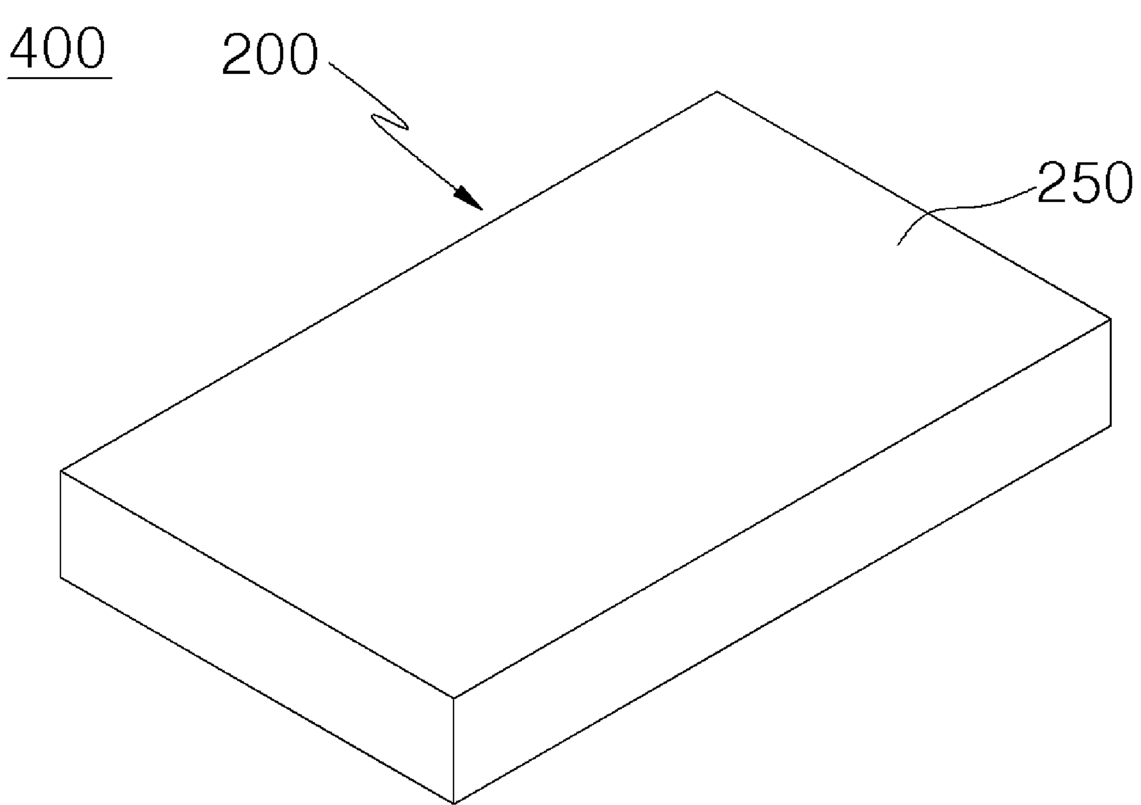
FIG. 3 is a schematic perspective view illustrating a lithium secondary battery with an integrated display panel in accordance with example embodiments.

FIG. 3 is a schematic perspective view illustrating a lithium secondary battery with an integrated display panel according to example embodiments.

Referring to FIG. 3, at least one surface of the outer case 200 of a lithium secondary battery with an integrated display panel ("display panel integrated lithium secondary battery") 400 may be provided as a display panel 250.

According to example embodiments, at least one surface of the outer case 200 may be provided to serve as the display panel 250. For example, outer surface(s) of the first housing part 210 and/or the second housing part 220 may be provided as the display panel(s) 250.

In some embodiments, when the display panels 250 are formed on two or more surfaces of the outer case 200, each display panel 250 may be provided with being electrically separated from each other. In addition, each of the display panels 250 may be independently driven.

In some embodiments, the pouch film(s) 260 of the first housing part 210 and/or the second housing part 220 may be removed, and the display panel(s) 250 may be provided at position(s) where the pouch film(s) is/are removed.

For example, the pouch film(s) 260 located in the recessed portion(s) of the first housing part 210 and/or the second housing part 220 may be cut and removed. The display panel 250 having the same size as the size of the removed pouch film may be inserted into the position of the removed pouch film to place the display panel 250.

For example, an adhesive is applied to a portion where the outer case 200 and the display panel 250 inserted into the position of the removed pouch film come into contact with each other, such that the display panel 250 may be adhered to the outer case 200. For example, a heat-curable adhesive is applied to the portion where the outer case 200 and the display panel 250 inserted into the position of the removed pouch film come into contact with each other, and then the heat-curable adhesive is cured, such that the outer case 200 and the display panel 250 may be bonded with each other.

Thereby, the display panel 250 is provided as at least one surface of the outer case 200, such that an image display function may be implemented even if a separate display panel is not connected or attached to the outer surface of the outer case 200. Accordingly, the above-described display panel integrated lithium secondary battery 400 may be provided as an image display device including a high-capacity battery with the same volume compared to an image display device to which a separate external display panel is connected.

Figure 4:
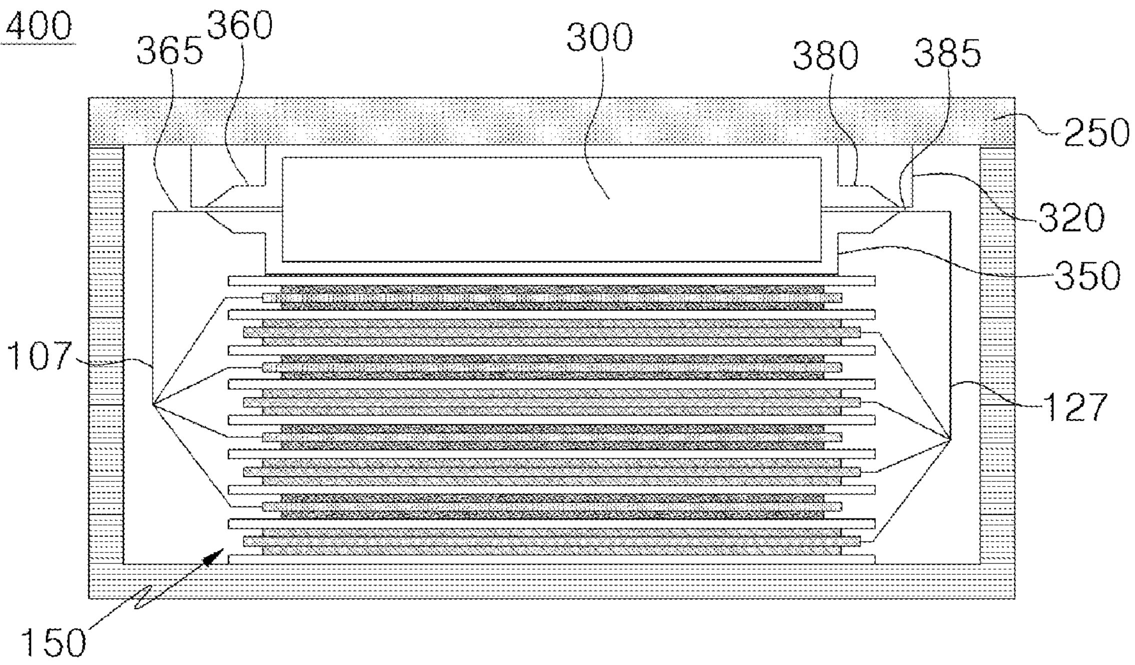
FIGS. 4 to 7 are schematic cross-sectional views illustrating lithium secondary batteries with integrated display panels in accordance with example embodiments.

FIG. 4 is a schematic cross-sectional view illustrating a display panel integrated lithium secondary battery in which one surface of the outer case 200 is provided as the display panel 250.

Referring to FIG. 4, a circuit structure 300 surrounded by a sealing case 350 may be disposed between the display panel 250 and the electrode assembly 150.

The display panel 250 may include, for example, a flat or curved liquid crystal display (LCD) panel and an organic light emitting display (OLED) panel, etc. In addition, the display panel 250 may include a pixel electrode, a pixel defining layer, a display layer, a counter electrode, and an encapsulation layer disposed on a panel substrate.

According to example embodiments, the circuit structure 300 may include a circuit board including a display panel driving integrated circuit chip for driving the display panel 250, connection lines 365 and 385 for connecting the circuit board with the electrode assembly 150, and a connection circuit wiring 320 for connecting the circuit board with the display panel 250. Accordingly, the display panel 250 may be directly being supplied with power and/or driven by the circuit structure 300 accommodated in the display panel integrated lithium secondary battery 400.

According to example embodiments, the circuit structure 300 may be surrounded by the sealing case 350. The sealing case 350 may include, for example, a transparent resin film including: an organic insulation material such as a urethane or acrylic urethane resin, an epoxy resin, an acrylic resin, and a polyimide resin, etc.; or an inorganic insulation material such as a silicon oxide, and silicon nitride glass, etc. These may be used alone or in combination of two or more thereof.

For example, even if the circuit structure 300 is disposed inside the outer case 200, contact with the electrolyte may be prevented by the sealing case 350. Thereby, driving stabilities of the circuit structure 300 and the display panel 250 may be improved.

In some embodiments, the sealing case 350 may include connection parts 360 and 380. Connection lines 365 and 385 may protrude to an outside through connection parts 360 and 380. The protruding connection lines 365 and 385 are connected with the electrode tabs 107 and 127 to supply power to the circuit structure 300.

For example, the connection parts 360 and 380 may include a cathode connection part 360 and an anode connection part 380. A cathode connection line 365 may protrude from the cathode connection part 360, thus to be connected to the cathode tab 107. An anode connection line 385 may protrude from the anode connection part 380, thus to be connected to the anode tab 127.

In some embodiments, the circuit structure 300 may include a connection circuit wiring 320 for electrically connecting the circuit board including the display panel driving integrated circuit chip with the display panel 250. For example, the connection circuit wiring 320 may protrude from the connection parts 360 and 380, thus to electrically connect the circuit board with the display panel 250. The display panel 250 may be driven by a display panel driving integrated circuit included in the circuit board.

Thereby, the display panel 250 may be driven even if a separate circuit board is not connected to an outside of the outer case 200. Accordingly, when the image display device includes the display panel integrated lithium secondary battery 400, space efficiency inside the image display device may be improved.

In some embodiments, an insulation film may be interposed between contact portions of the connection parts 360 and 380 with the connection lines 365 and 385, respectively. The insulation film may improve a sealing force in contact regions of the connection parts 360 and 380 with the connection lines 365 and 385, respectively. Accordingly, the circuit board may be stably sealed inside the sealing case 350.

Figure 5:
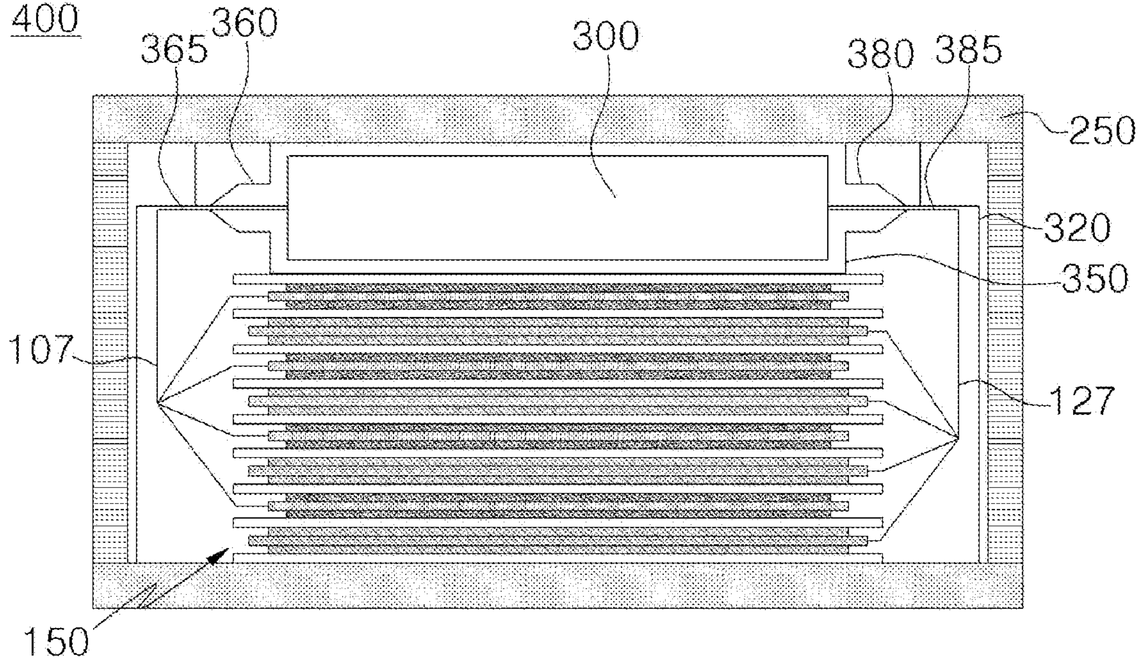
Figure 6:
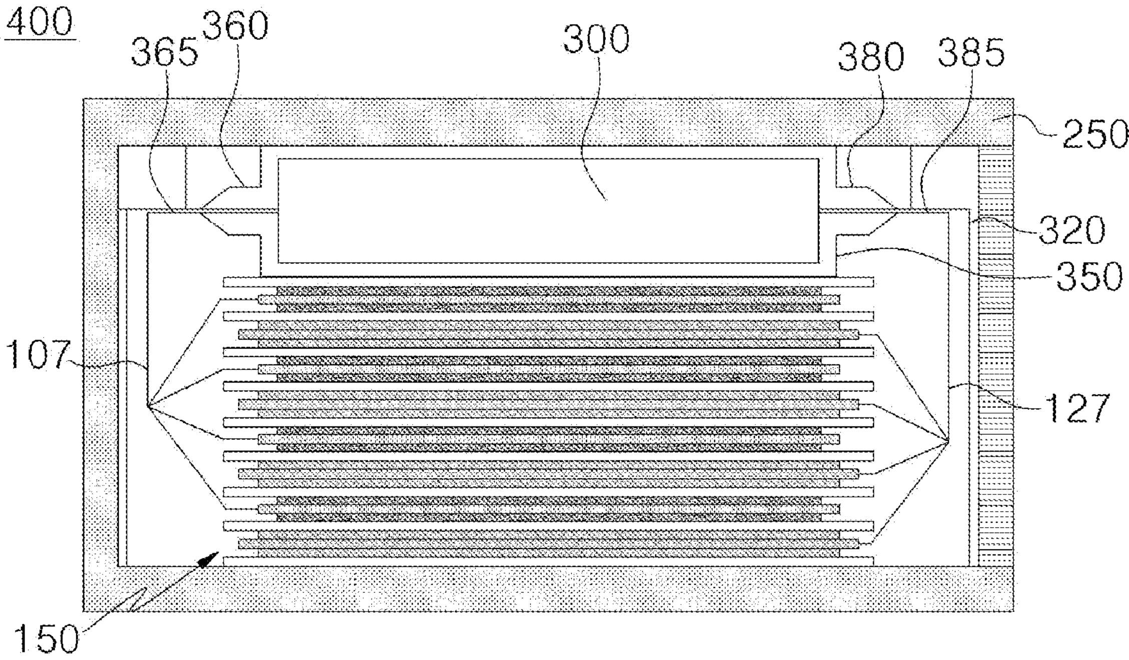
Figure 7:
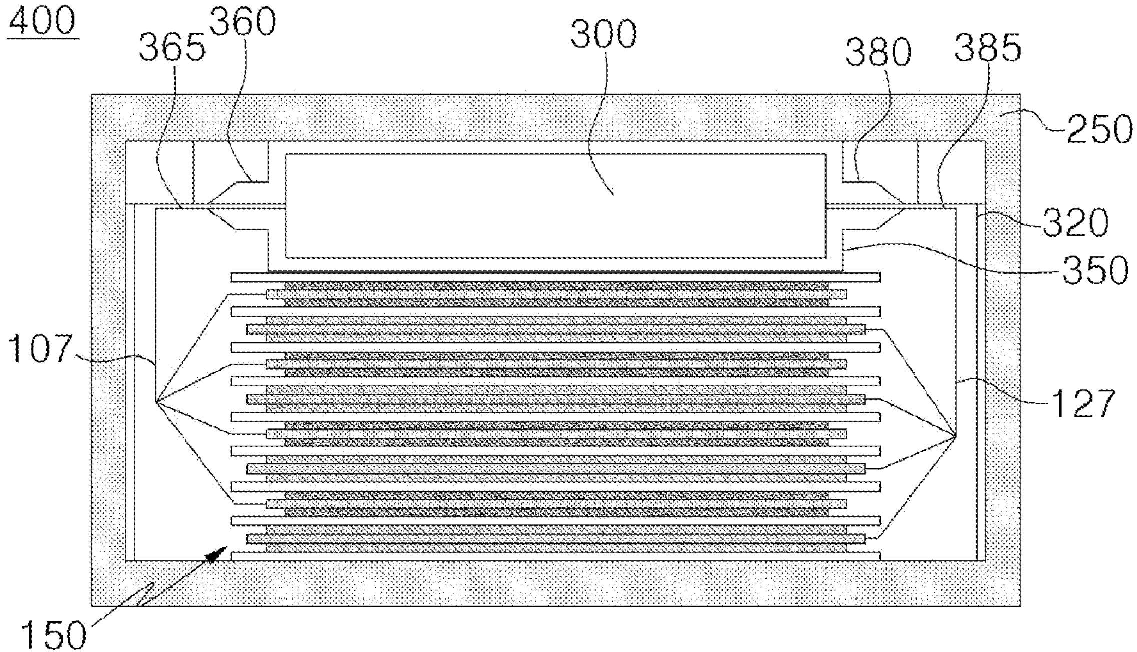

FIGS. 5 to 7 are schematic cross-sectional views illustrating display panel integrated lithium secondary batteries in which a plurality of surfaces of the outer case 200 are provided as the display panel 250. The structures and components of the display panel integrated lithium secondary batteries, which are substantially the same as or similar to those of the display panel integrated lithium secondary battery described with reference to FIG. 4, will not be described in detail.

Referring to FIG. 5, both facing surfaces of the outer case 200 may be provided as the display panels 250.

According to example embodiments, the display panels 250 may be formed on both facing surfaces of the outer case 200 and driven independently of each other.

In some embodiments, when the display panels 250 are provided on both facing surfaces of the outer case 200, two connection circuit wirings 320 may be included in the circuit structure 300. Accordingly, the two connection circuit wirings 320 are respectively connected to the display panels 250, such that the display panels 250 may be driven by one circuit board.

Referring to FIG. 6, three surfaces of the outer case 200 may be provided as the display panel 250.

According to example embodiments, the display panels 250 may be formed on three surfaces of the outer case 200 and driven independently of each other.

In some embodiments, when the display panels 250 are provided on three surfaces of the outer case 200, three connection circuit wirings 320 may be included in the circuit structure 300. Accordingly, the three connection circuit wirings 320 are respectively connected to the display panels 250, such that the display panels 250 may be driven by one circuit board.

Referring to FIG. 7, four surfaces of the outer case 200 may be provided as the display panel 250.

According to example embodiments, the display panels 250 may be formed on four surfaces of the outer case 200 and driven independently of each other.

In some embodiments, when the display panels 250 are provided on four surfaces of the outer case 200, four connection circuit wirings 320 may be included in the circuit structure 300. Accordingly, the four connection circuit wirings 320 are respectively connected to the display panels 250, such that the display panels 250 may be driven by one circuit board.

According to example embodiments, the type of outer case 200 is not limited. For example, the outer case may be a square-shaped outer case for a secondary battery. At least one surface of the square-shaped outer case for a secondary battery may be provided as the display panel 250 as described above.

According to example embodiments, the display panel integrated lithium secondary battery 400 may be provided as an image display device. In this case, the image display device may exclude the connection of a separate external display panel, thereby improving capacity characteristics per unit volume.

The image display device may be implemented as a portable electronic device such as a mobile phone, a tablet, a laptop computer and the like.

What is claimed is:

1. A lithium secondary battery with an integrated display panel comprising:

an electrode assembly which comprises a cathode and an anode disposed to face the cathode;

an outer case which accommodates the electrode assembly and has at least one surface provided as a display panel;

a circuit structure disposed between the electrode assembly and the display panel, and electrically connected with the display panel; and a sealing case which surrounds the circuit structure, wherein at least one surface of the sealing case comprises a connection part which electrically connects the circuit structure with the electrode assembly.

2. The lithium secondary battery with an integrated display panel according to claim 1, wherein the cathode comprises a cathode current collector, a cathode active material layer formed on at least one surface of the cathode current collector, and a cathode tab protruding from the cathode current collector, and the anode comprises an anode current collector, an anode active material layer formed on at least one surface of the anode current collector, and an anode tab protruding from the anode current collector.

3. The lithium secondary battery with an integrated display panel according to claim 2, wherein the cathode tab and the anode tab are disposed only inside the outer case.

4. The lithium secondary battery with an integrated display panel according to claim 2, wherein the connection part comprises a cathode connection part electrically connected to the cathode tab, and an anode connection part electrically connected to the anode tab.

5. The lithium secondary battery with an integrated display panel according to claim 4, wherein the circuit structure further comprises a cathode connection line which extends toward the cathode connection part to be electrically connected to the cathode tab, and an anode connection line which extends toward the anode connection part to be electrically connected to the anode tab.

6. The lithium secondary battery with an integrated display panel according to claim 2, wherein the circuit structure comprises a display panel driving integrated circuit chip, and a connection circuit wiring which electrically connects the display panel driving integrated circuit chip with the display panel.

7. The lithium secondary battery with an integrated display panel according to claim 1, wherein two surfaces of the outer case facing each other are provided as the display panel.

* * * * *